(12) United States Patent
Gong et al.

(10) Patent No.: US 8,633,386 B2
(45) Date of Patent: Jan. 21, 2014

(54) CABLE MANAGEMENT DEVICE AND SERVER USING SAME

(75) Inventors: Xin-Hu Gong, Shenzhen (CN); Si-Wen Shu, Shenzhen (CN); Ju-Wen Dai, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 125 days.

(21) Appl. No.: 13/327,485

(22) Filed: Dec. 15, 2011

(65) Prior Publication Data
US 2013/0003317 A1    Jan. 3, 2013

(30) Foreign Application Priority Data
Jun. 30, 2011    (CN) .......................... 2011 1 0180008

(51) Int. Cl.
*H01B 7/06* (2006.01)
(52) U.S. Cl.
USPC ............. 174/69; 174/72 A; 361/826; 439/501
(58) Field of Classification Search
USPC ............. 211/26; 361/826, 827, 725; 174/651, 174/69, 99 R, 101
See application file for complete search history.

(56) References Cited

U.S. PATENT DOCUMENTS

| | | | |
|---|---|---|---|
| 3,710,199 A * | 1/1973 | Cignoni, Jr. .................. | 361/827 |
| 5,716,730 A * | 2/1998 | Deguchi .......................... | 429/97 |
| 6,646,893 B1 * | 11/2003 | Hardt et al. .................... | 361/826 |
| 6,902,069 B2 * | 6/2005 | Hartman et al. ................ | 211/26 |
| 6,944,383 B1 * | 9/2005 | Herzog et al. ................. | 385/123 |
| 7,057,110 B2 * | 6/2006 | Tsubaki et al. ............. | 174/72 A |
| 7,306,481 B2 * | 12/2007 | Tsukamoto .................... | 439/501 |
| 7,318,731 B2 * | 1/2008 | Lin et al. ......................... | 439/97 |
| 2003/0037958 A1 * | 2/2003 | Watanabe et al. ............. | 174/135 |
| 2004/0251220 A1 * | 12/2004 | Mertesdorf et al. ............ | 211/26 |
| 2006/0134970 A1 * | 6/2006 | Watanabe et al. ............. | 439/501 |
| 2007/0048599 A1 * | 3/2007 | Choi ............................... | 429/97 |
| 2010/0086275 A1 * | 4/2010 | Krampotich et al. ......... | 385/135 |

OTHER PUBLICATIONS

Authors: IBM; Cutts, SJ; Edmunds, A; Golledge, I; Hamper, AN Title: Cable Management System Pub. Date: Sep. 1, 1993 IBM Technical Database: TDB v36 n9B 09-93 p. 573-574 IP.com #: IPCOM000106611D.*

* cited by examiner

*Primary Examiner* — Hoa C Nguyen
*Assistant Examiner* — Keith Depew
(74) *Attorney, Agent, or Firm* — Altis Law Group, Inc.

(57) ABSTRACT

A cable management device includes a shell, a driving assembly and a cover. The shell includes a first coil winder and a second coil winder. The driving assembly is slidably fixed to the shell, the driving assembly including a sliding rack and a rotating rack. The cover is releasably latched to the shell. The cable assembly includes a first end, a second end and a coil section. The first end is fixed to the driving assembly, the second end is fixed to the shell. The coil section is wound onto the first coil winder and the second coil winder. When the driving assembly is slid out of the shell, the driving assembly stretches the coil section, and the rotating rack rotates relative to the sliding rack, bending the cable assembly.

19 Claims, 12 Drawing Sheets

CABLE MANAGEMENT DEVICE AND SERVER USING SAME

BACKGROUND

1. Technical Field

This disclosure relates to cable management devices, and in particular, to a cable management device for a server.

2. Description of Related Art

A server may include a server casing and a power supply located at a rear portion of the server casing. The power supply is connected to an outer power source to supply electric energy to the server. However, the power supply would be located somewhere at the front portion of the server casing. In this condition, the server needs an extra cable passing through the server from the front portion to the rear portion, to connect the power supply and the outer power source. The extra cable presents difficulties and is very difficult to manage during setup and configuration of the server since the extra cable should pass through the server casing, and the server includes many devices in the server casing blocking the passage of the cable.

Therefore, there is a room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary cable management device and the server using the cable management device. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
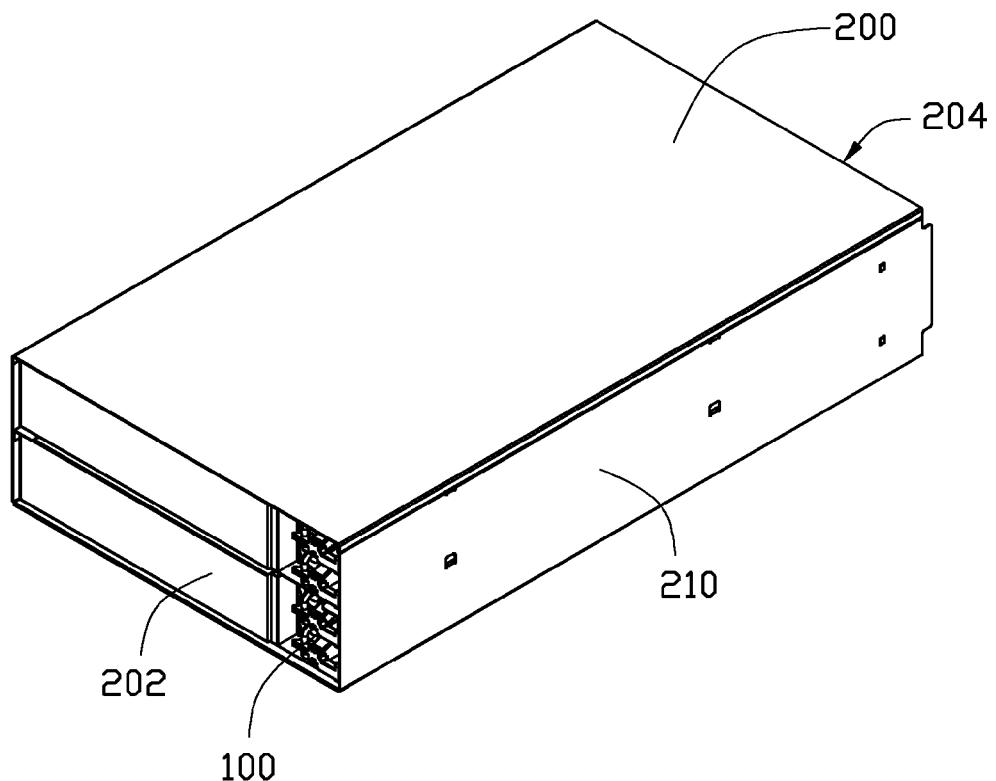
FIG. 1 is a schematic view of a server casing with a cable management device according to an exemplary embodiment.
Figure 2:
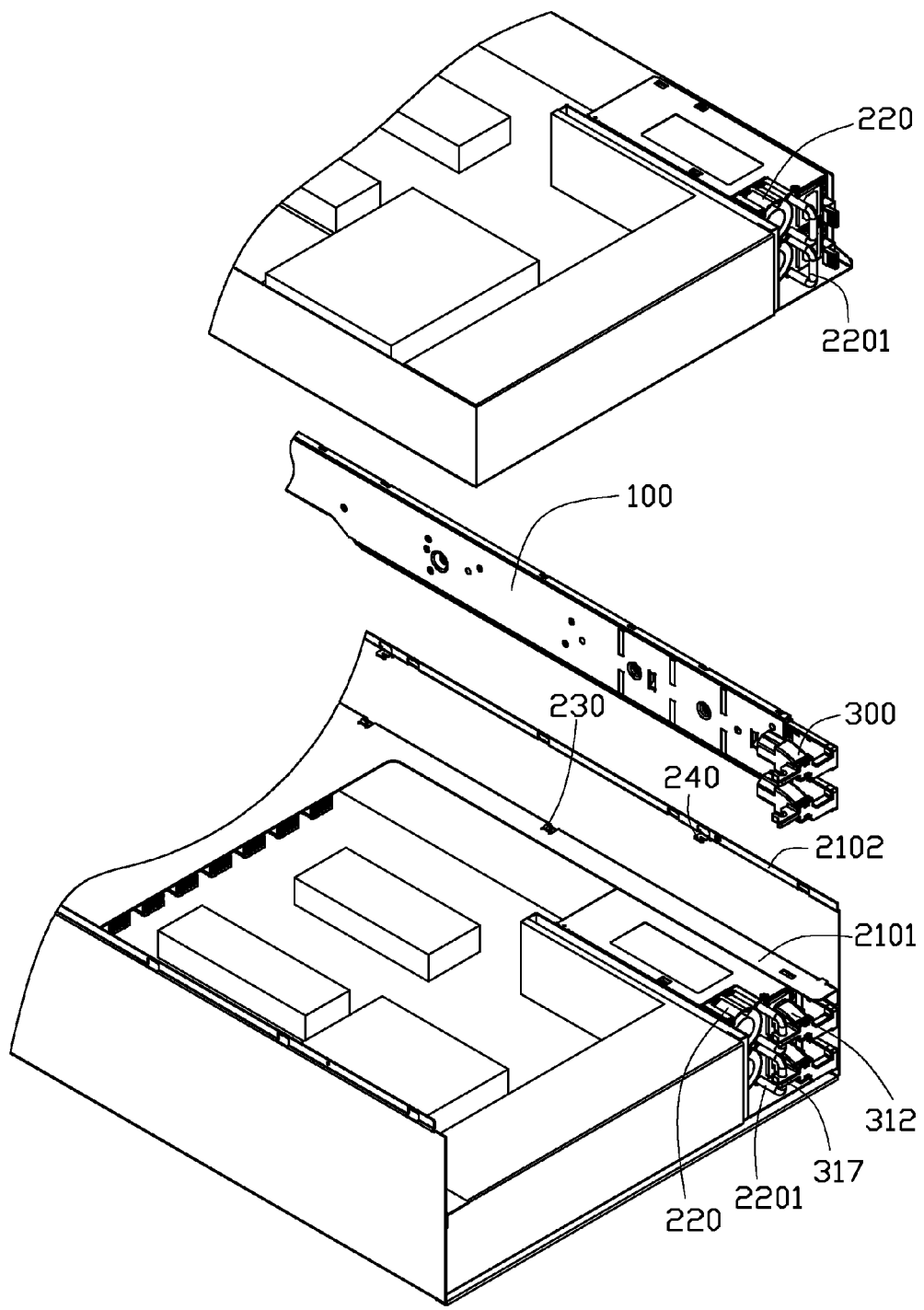
FIG. 2 is an exploded view of the server casing and the cable management device of FIG. 1.
Figure 3:
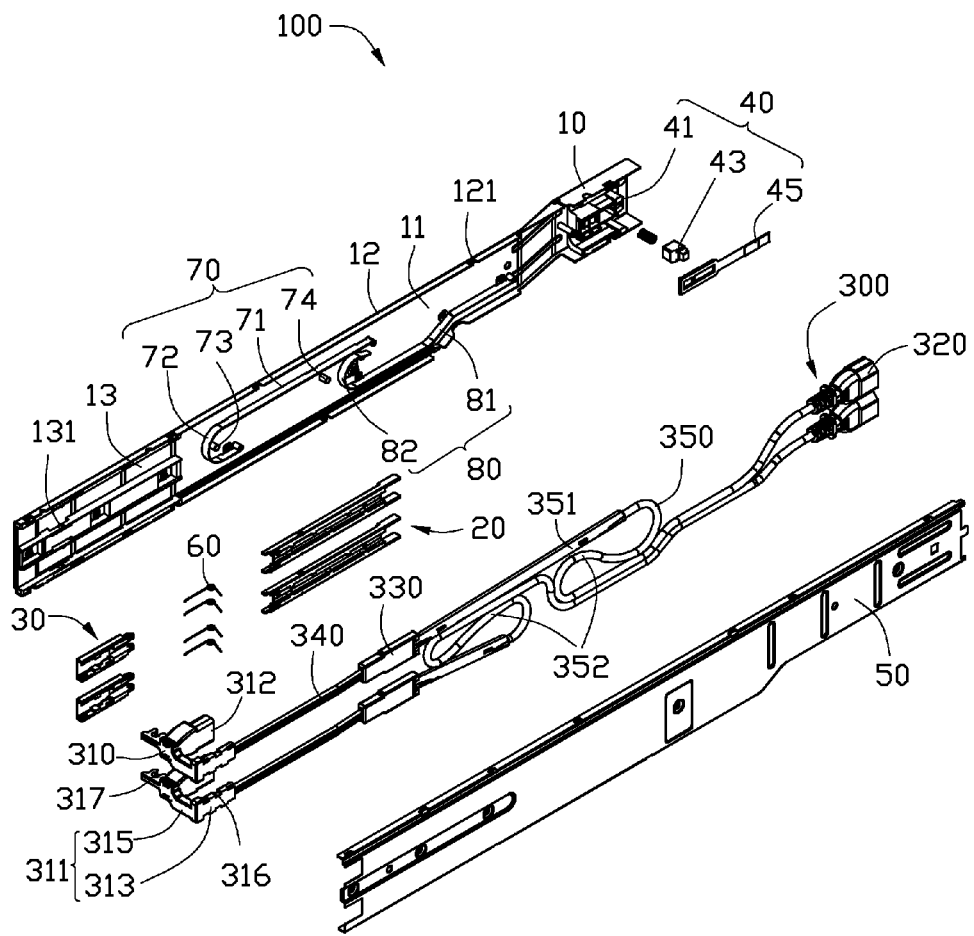
FIG. 3 is an exploded view of the cable management device and a cable of FIG. 2.

Referring to FIGS. 1 to 3, an exemplary embodiment of a server includes a server casing 200, four cable assemblies 300, and two cable assembly management devices 100 for managing the cable assemblies 300. The server casing 200 includes a front end 202, a rear end 204, a sidewall 210 and two power supplies 220. The power supplies 220 are located in the server casing 200 near or at the front end 202, and each power supply 220 is electrically connected to two of the cable assemblies 300.

Each power supply 220 includes a U-shaped operating rod 2201. The sidewall 210 includes a resisting board 2101 and two mounting ribs 2102, and the resisting board 2101 is located between the mounting ribs 2102. Each cable management device 100 and a corresponding power supply 220 are located between one of the mounting ribs 2102 and the resisting board 2101. A plurality of hooks 240 protrudes from each mounting rib 2102. A plurality of limiting plates 230 protrudes from the resisting board 2101 parallel to the sidewall 210.

Referring to FIG. 3, each cable assembly 300 includes a first cable 340 with a first connector 310 at one end of the first cable 340, a second cable 350 with a second connector 320 at one end of the first cable 340, a third connector 330 electrically connecting the first cable 340 and the second cable 350 so that the first connector 310 and the second connector 320 are electrically connected by the first cable 340, the second cable 350 and the third connector 330. The first connector 310 includes an L-shaped main body 311 and a first jack 312 located at the main body 311. The main body 311 includes a connecting section 313 and a retaining section 315 bent from a distal end of the connecting section 313. The connecting section 313 is connected to the first cable 340 and defines a notch 316. The retaining section 315 defines a securing groove 317 located at the same side of the first jack 312.

Figure 11:
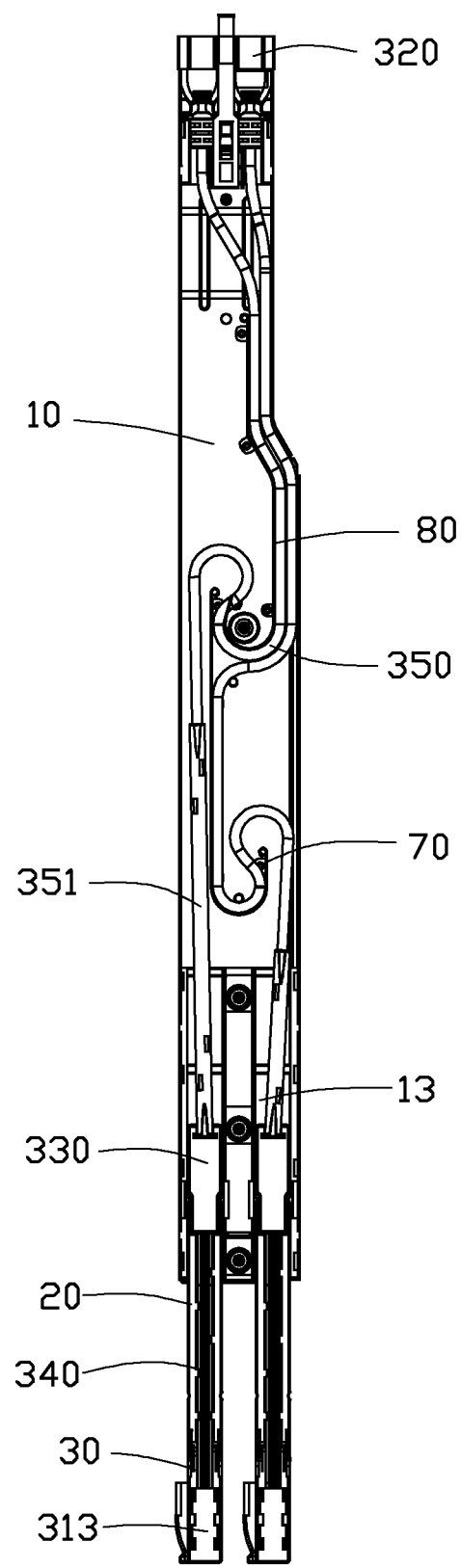
FIG. 11 is similar to FIG. 10, but with the cable pulled out of the cable management device.

Each cable assembly 300 further includes a cable duct 351 wrapping the second cable 350 adjacent to the third connector 330. The cable duct 351 is used to guide the movement of the second cable 350. The second cable 350 includes a coiled section 352 between the second connector 320 and the cable duct 351. When the first connectors 310 are pulled away from the second connectors 320, the coiled sections 352 will stretch (as shown in FIG. 11).

Figure 12:
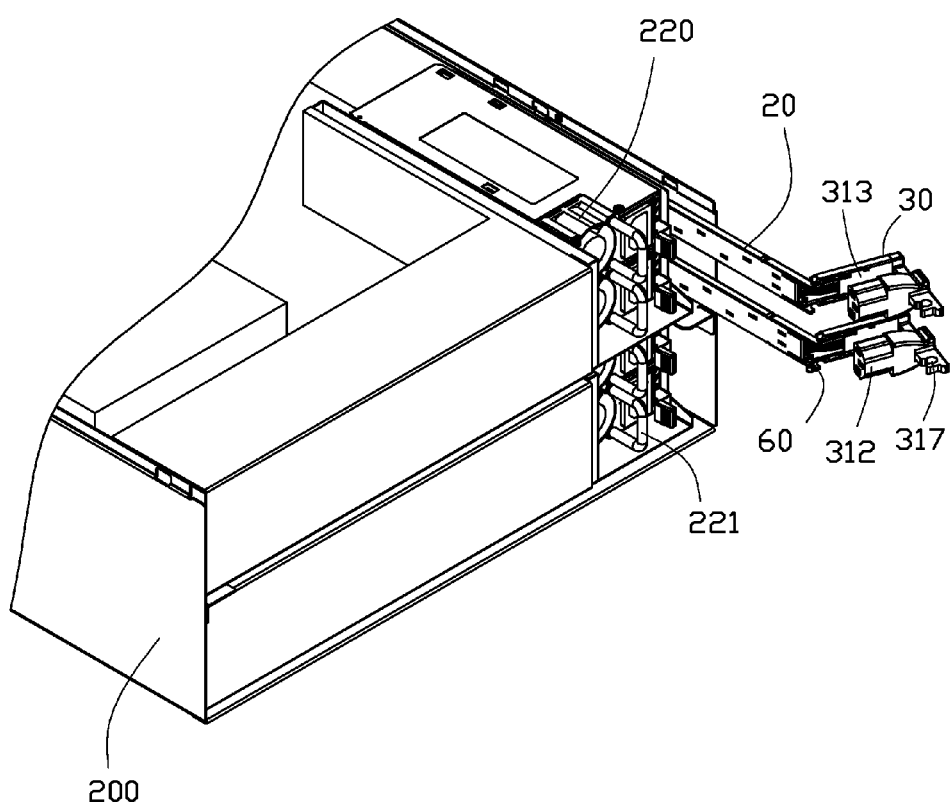
FIG. 12 is a schematic view of the server casing and the cable management device with the cable pulled out of the cable management device.

Referring to FIGS. 2 and 3, each cable management device 100 includes a shell 10, two sliding racks 20, two rotating racks 30, a positioning assembly 40, a cover 50 and a plurality of torsion springs 60. The sliding racks 20 and the positioning assembly 40 are fixed to the shell 10. Referring to FIG. 12, each rotating rack 30 is hinged to one of the sliding racks 20 to form a driving assembly (not labeled) so the rotating racks 30 can rotate relative to the sliding racks 20. The torsion springs 60 are located between the sliding racks 20 and the rotating racks 30 to provide a force to restore the rotating racks 30 to their original states. The cover 50 is mounted to the shell 10 to cover the sliding racks 20, the rotating racks 30, the positioning assembly 40 and the torsion springs 60.

Figure 6:
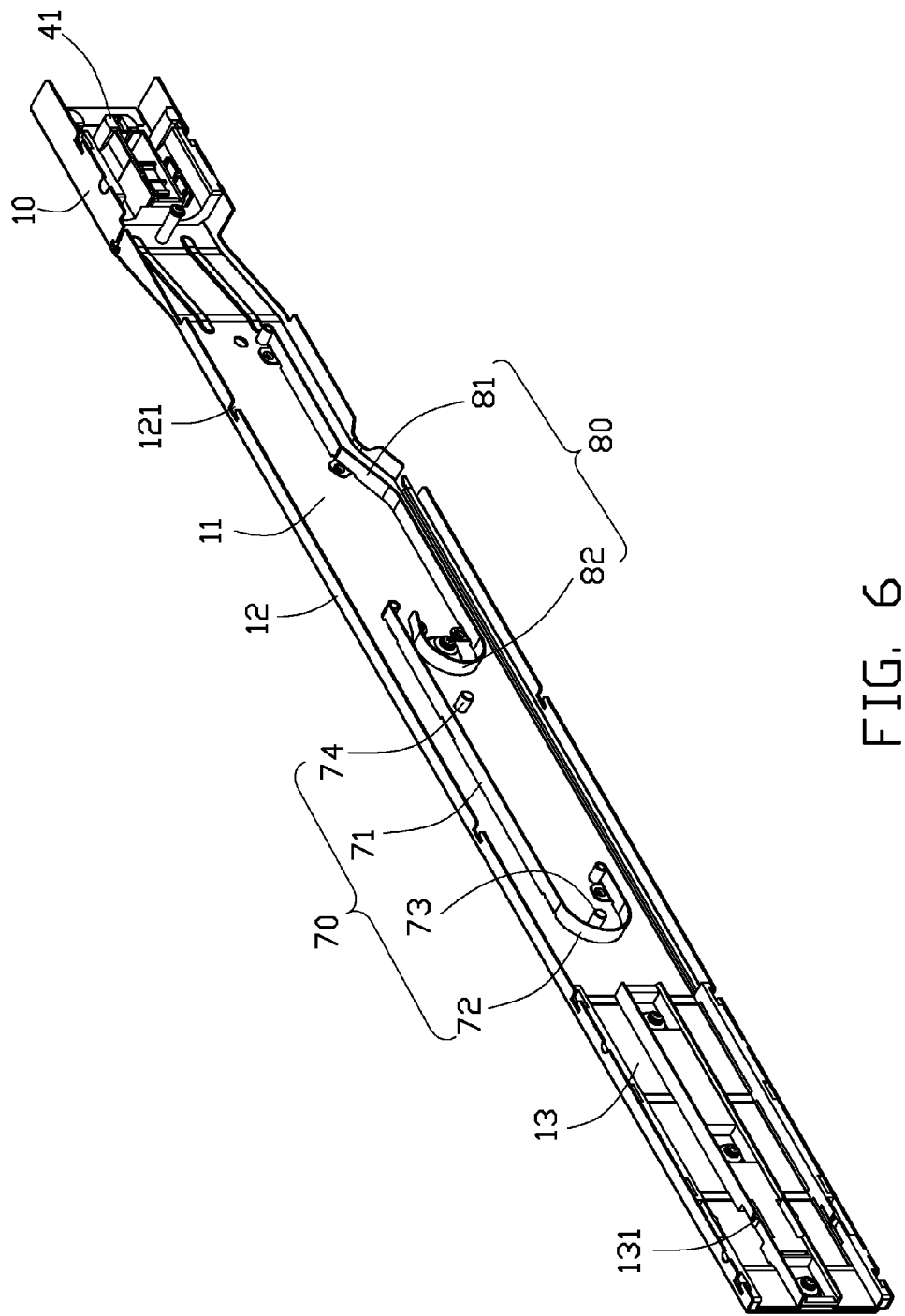
FIG. 6 is an enlarged view of a shell of the cable management device of FIG. 3.

Referring to FIGS. 3 and 6, the shell 10 includes a main panel 11 and two side panels 12 at opposite edges of the main panel 11. The main panel 11 defines two guiding grooves 13 between the side panels 12 at one end thereof. Each driving assembly, i.e., each sliding rack 20 and a corresponding rotating rack 30 is slidably received in one of the guiding grooves 13. The shell 10 further includes a plurality of stopping members 131 located in the guiding grooves 13 to prevent the sliding racks 20 sliding out of the guiding grooves 13. The positioning assembly 40 is fixed to the other end of the main panel 11 opposite the guiding grooves 13. The main panel 11 further includes a first coil winder 70 and a second coil winder 80, both of which are located between the positioning assembly 40 and the guiding grooves 13. Each side panel 12 defines a plurality of latching troughs 121.

The first coil winder 70 includes a first guiding plate 71, a first guiding pole 73 and a second guiding pole 74. The first guiding plate 71 includes a first arcuate panel 72 protruding from one end thereof. The first, second, guiding poles 73, 74 are located at or near opposite ends of the first guiding plate 71. The second coil winder 80 includes a second guiding plate 81. The second guiding plate 81 includes a second arcuate panel 82 protruding from one end thereof.

Figure 4:
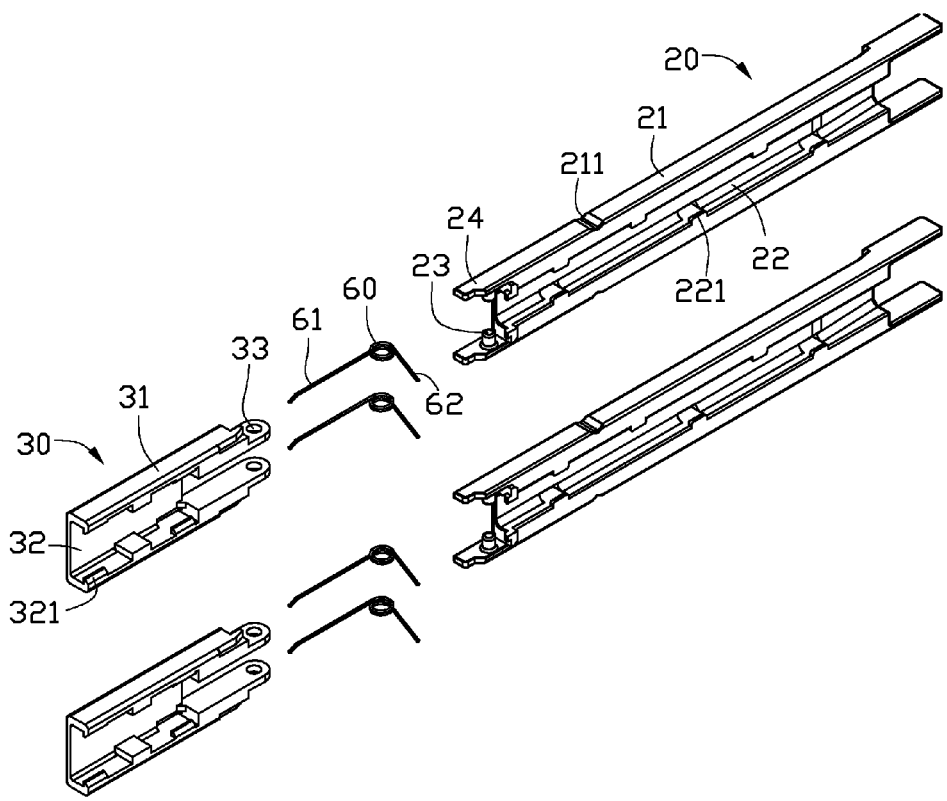
FIG. 4 is a schematic view of sliding racks, elastic elements and rotating racks of the cable management device of FIG. 3.

Referring to FIG. 4, each sliding rack 20 includes two opposite sliding boards 21 and a receiving groove 22 defined between the sliding boards 21. Each sliding board 21 defines a recess 211 to correspond to the stopping members 131. The recesses 211 engage the stopping members 131 to prevent the sliding racks 20 sliding out of the guiding grooves 13. A mounting block 24 protrudes from one end of each sliding board 21 and a shaft 23 protrudes from each of the mounting blocks 24. Each sliding board 21 may further includes a plurality of stopping plates 221 protruding toward the opposite sliding board 21. The stopping plates 221 prevent the cable assemblies 300 coming out of the receiving grooves 22.

Each rotating rack 30 includes two opposite sliding panels 31 and a channel 32 defined between the sliding panel 31. Each sliding panel 31 defines a shaft hole 33, in which one of the shafts 23 is rotatably received so the rotating racks 30 can rotate (relative to the sliding racks 20) around the shafts 23. After the rotating racks 30 are hinged to the sliding racks 20, the receiving grooves 22 communicate with corresponding channels 32. A securing block 321 protrudes from each sliding panel 31 for securing the cable assembly 300.

Each torsion spring 60 includes a first end 61 and a second end 62. The torsion springs 60 are wound on the shafts 23 with the first ends 61 resisting the rotating racks 30 and the second ends 62 resisting the sliding racks 20. The torsion springs 60 drives the rotating racks 30 to rotate relative to the sliding racks 20.

Figure 5:
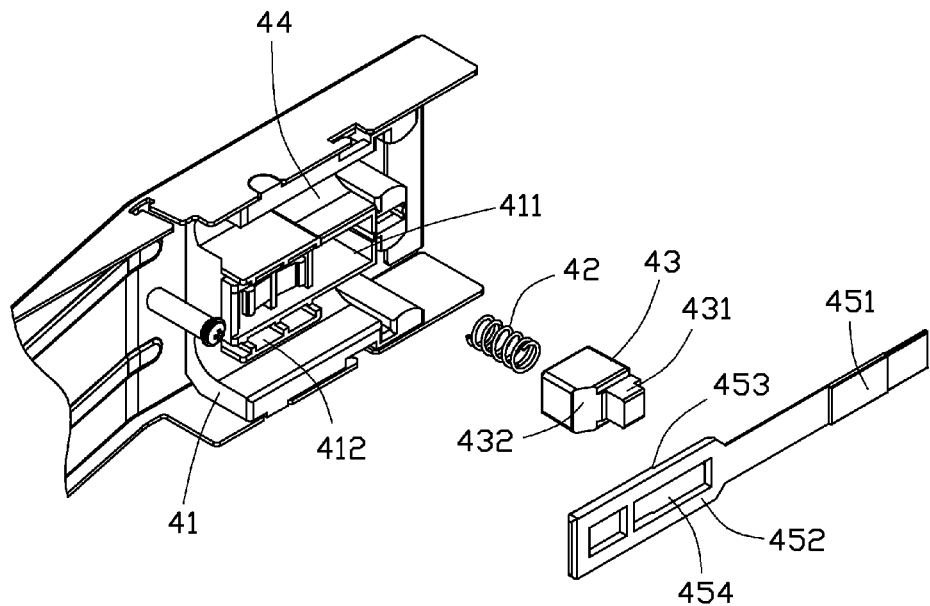
FIG. 5 is a schematic view of a positioning mechanism of the cable management device of FIG. 3.

Referring to FIGS. 1 and 5, the positioning assembly 40 includes a fixed board 41, a latching block 43, a coil spring 42 and a movable board 45. The fixed board 41 defines a receptacle 411 and two receiving spaces 44 at opposite sides of the receptacle 411. The fixed board 41 further includes two latching panels 412, and each latching panel 412 is located between one of the receiving spaces 44 and the receptacle 411. The coil spring 42 and the latching block 43 are in turn received in the receptacle 411. The latching block 43 includes a positioning protrusion 431 opposite to the coil spring 42, and a sloped surface 432 adjacent to the positioning protrusion 431. The movable board 45 includes a pulling section 451 and a sliding section 452 protruding from the pulling section 451. A shoulder 453 protrudes from the sliding section 452. The movable board 45 further defines a latching groove 454 through the sliding section 452. The sliding section 452 is slidably mounted between the latching panels 412. The positioning protrusion 431 is latched in the latching groove 454. The pulling section 451 extends out of the fixed board 41. When the pulling section 451 is pulled, the shoulder 453 biases the sloped surface 432 to press the latching block 43 into the receptacle 411, compressing the coil spring 42 until the positioning protrusion 431 slides out of the latching groove 454.

Figure 7:
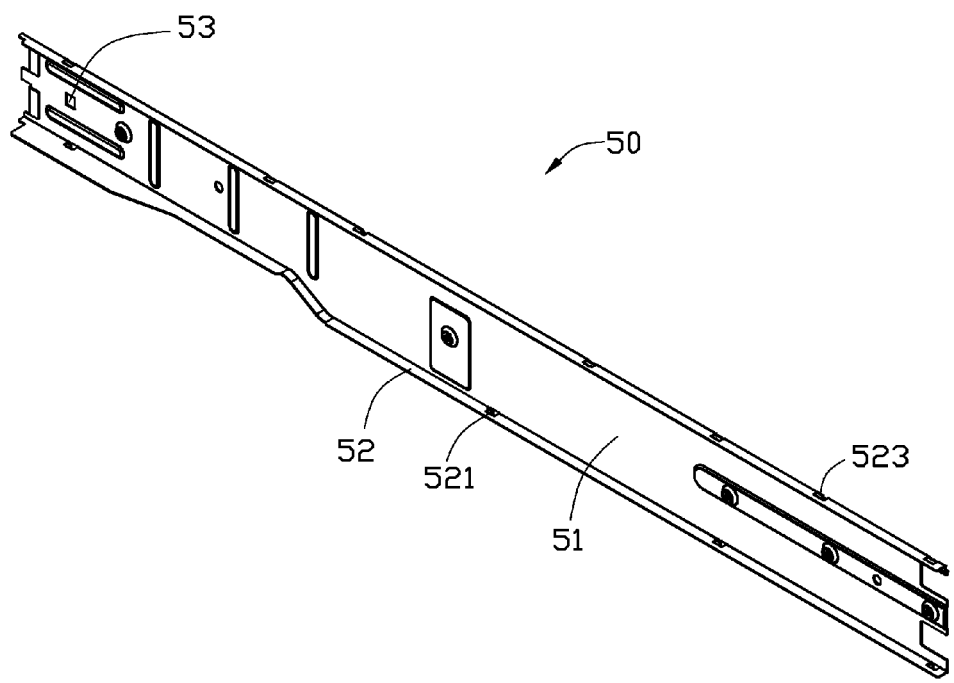
FIG. 7 is an enlarged view of a cover of the cable management device of FIG. 3.

Referring to FIGS. 3 and 7, the cover 50 has a shape and a size corresponding to the shell 10, and is latched to the shell 10. The cover 50 includes a main board 51 and side boards 52 protruding from opposite edges of the main board 51. Each side board 52 has a plurality of latching portions 521 to correspond to the latching troughs 121. Each latching portion 521 is latched in one of the latching troughs 121 so the cover 50 is latched to the shell 10. A plurality of latching plates 523 corresponding to the hooks 240 protrudes from one of the side boards 52. Each latching plate 523 is latched to a hook 240 so that the cover 50 is latched to the server casing 200. The main board 51 defines a latching hole 53, in which the positioning protrusion 431 is latched.

Referring to FIGS. 3-4, 8 to 10, a cable module (not labeled) including two cable assemblies 300 and a cable management device 100 may be assembled in the following way: the connecting sections 313 are latched in the channels 32 with the securing blocks 321 secured in the notches 316. The first cables 340 pass through the channels 32 and the receiving grooves 22 with the third connectors 330 being received in the receiving grooves 22. The stopping plates 221 stop the first cables 340 sliding out of the receiving grooves 22. One of the cable ducts 351 is supported by the first guiding plate 71, and the second cable 350 is wound onto the second arcuate panel 82 and supported by the second guiding plate 81, and then the second connector 320 is received in one of the receiving spaces 44. The other cable duct 351 is supported by the adjacent side panel 12, and the second cable 350 is wound in turn onto the first guiding pole 73 and the second guiding pole 74, to overlap the other second cable 350, and the second connector 320 is received in the other receiving space 44. The cover 50 is latched to the shell 10 with the positioning protrusion 431 latched in the latching hole 53, to yield a fully assembled cable module.

Referring to FIG. 2, the cable management device 100 is latched between the limiting plates 230 and the sidewall 210, and the hooks 240 latch with the latching plates 523. Each first connector 310 is inserted into one of the power supplies 220. Each operating rod 2201 is secured in one of the securing grooves 317. The cable assemblies 300 are thus fixed to the server casing 200 by the cable management devices 100.

Referring to FIGS. 11 and 12, to pull the first connectors 310 out of the server casing 200, the retaining sections 315 are pulled until the operating rods 2201 slide out of the securing grooves 317. Then, the first connectors 310 are steadily pulled to make the stopping members 131 slide out of the recesses 211, so the rotating racks 30 and the sliding racks 20 slide in the guiding grooves 13 relative to the shell 10, until the third connectors 330 are stopped by the stopping members 131. At this time, the second cables 350 are stretched along the first guiding plate 71 and the second guiding plate 81, to facilitate the smooth removal of the first connectors 310 from the server casing 200.

Figure 8:
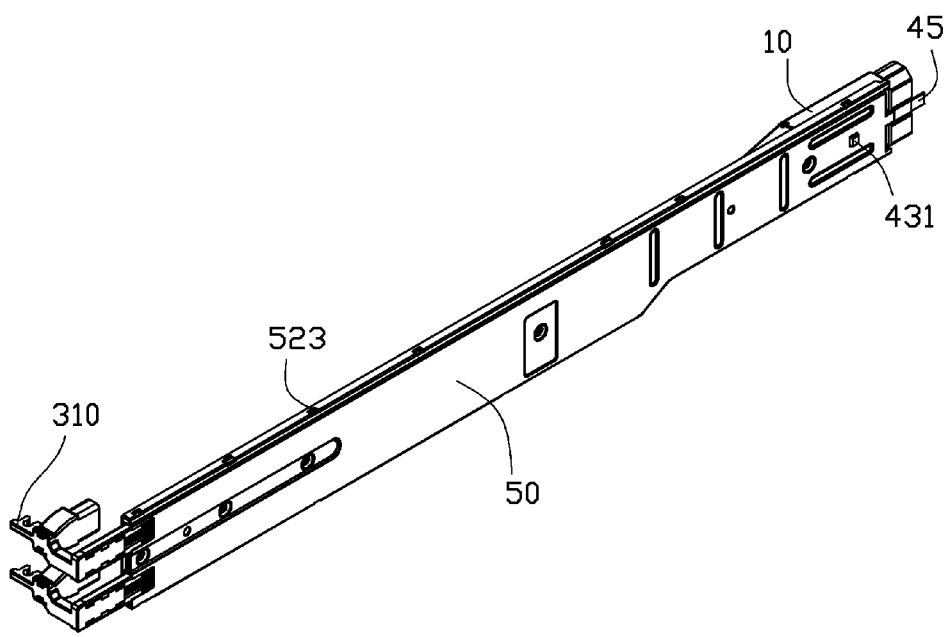
FIG. 8 is an assembled view of the cable management device and the cable of FIG. 3.
Figure 9:
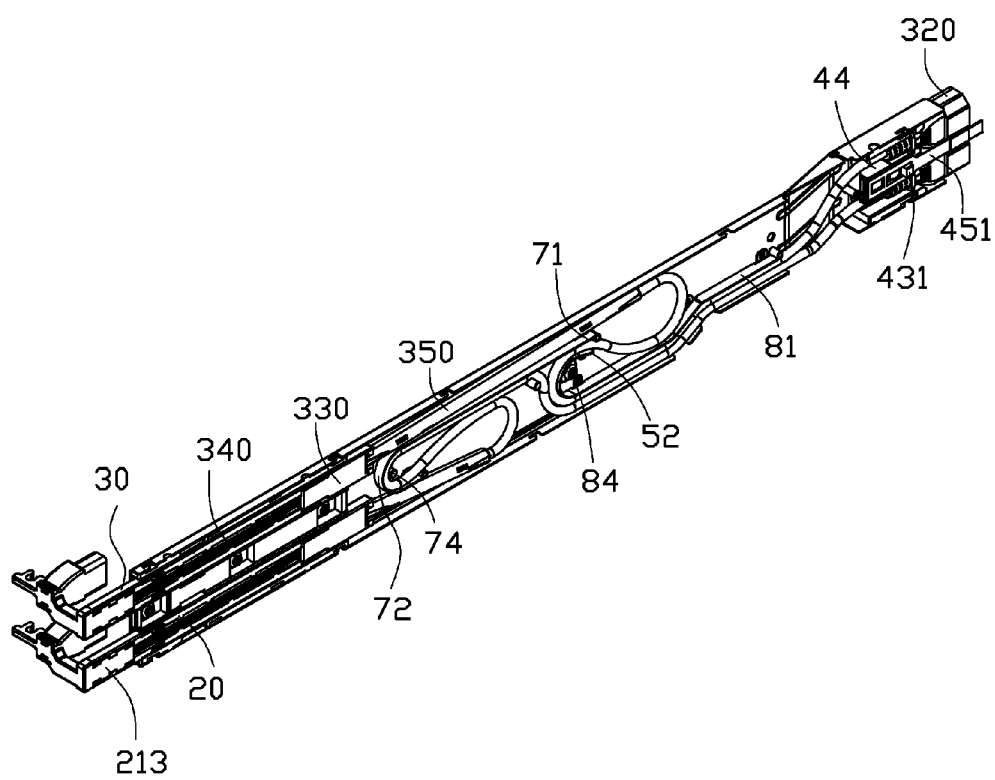
FIG. 9 is an assembled view of the cable management device and the cable of FIG. 3, without the cover.
Figure 10:
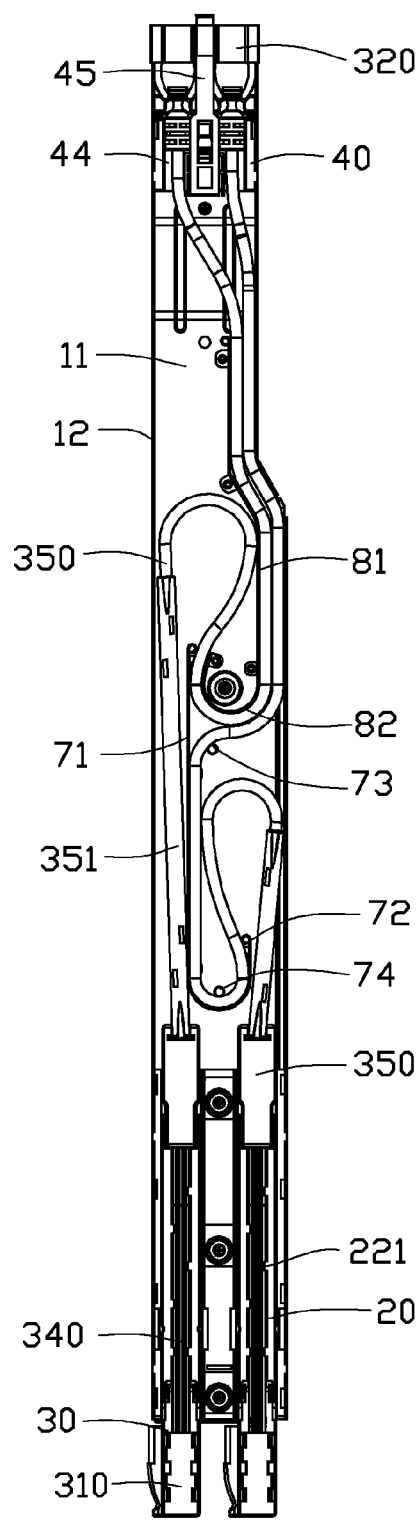
FIG. 10 is an enlarged and plan view of the cable management device and the cable of FIG. 3.

To push the first connectors 310 back into the server casing 200, the rotating racks 30 and the sliding racks 20 are pushed until the stopping members 131 are again latched in the recesses 211. At this time, the second cables 350 are wound onto the first coil winder 70 and the second coil winder 80. Referring to FIGS. 5, 8 and 9, to exchange the cable assemblies 300, the cable management device 100 is detached from the server casing 200, and the movable plates are pulled until the positioning protrusions 431 slide out of the latching holes 53. The latching plates 523 are detached from the latching troughs 121 so the cover 50 may be detached from the shell 10. The cable assemblies 300 may thus be changed or replaced.

It is to be further understood that even though numerous characteristics and advantages of the exemplary embodiments have been set forth in the foregoing description, together with details of structures and functions of various embodiments, the disclosure is illustrative only, and changes may be made in detail, especially in the matters of shape, size, and arrangement of parts within the principles of the exemplary invention to the full extent indicated by the broad general meaning of the terms in which the appended claims are expressed.

What is claimed is:

1. A cable management device for managing a cable assembly, the cable management device comprising:
   a shell including a first coil winder, a second coil winder, a guiding groove, and at least one stopping member located in the guiding groove;
   a driving assembly slidably fixed in the guiding groove, the driving assembly including a sliding rack and a rotating rack hinged to the sliding rack;
   a cover releasably latched to the shell;
   wherein the cable assembly includes a first end, a second end and a coil section between the first end and the second end; the first end is fixed to the driving assembly, the second end is fixed to the shell; the coil section is wound to the first coil winder and the second coil winder; when the driving assembly slides out of the shell, the driving assembly drives the coil section to be stretched, and the rotating rack rotates relative to the sliding rack to drive the cable assembly to be bent; when the driving assembly slides back in the shell, the coil section is wound to the first coil winder and the second coil winder; the sliding rack comprises two sliding boards, two shafts, and two torsion springs, each sliding board defines a recess, each stopping member is latched in one of the recesses to position the driving assembly in the guiding groove; each shaft protrudes from one of the sliding boards, each torsion spring is wound on one of the shafts; the rotating rack comprises two sliding panels, each panel defines a shaft hole, in which one of the shafts is rotatably fixed so the rotating rack is capable of rotating relative to the sliding rack; the torsion springs provides an elastic force to drive the rotating rack to rotate relative to the sliding rack.

2. The cable management device of claim 1, wherein the sliding rack defines a receiving groove between the sliding boards, in which the cable assembly received; each sliding board protrudes a plurality of stopping plates toward the other sliding board to prevent the cable assembly out of the receiving groove.

3. The cable management device of claim 1, wherein the rotating rack defines a channel, the cable assembly passes through the channel; each panel protrudes a securing block, the cable assembly defines opposite notches, the securing blocks are secured in the notches to prevent the cable assembly and the rotating rack from separation.

4. The cable management device of claim 1, further comprising a fixed board defining a receiving space, in which the second end is fixed.

5. The cable management device of claim 1, further comprising a positioning assembly including a fixed board, a latching block, a coil spring and a movable board slidably fixed to the fixed board; the fixed board further defines a receptacle, in which the coil spring and the latching block are received in turn; the movable board defines a latching groove, in which the latching block is releasably latched.

6. The cable management device of claim 5, wherein the latching block includes a positioning protrusion opposite to the coil spring, and a sloped surface adjacent to the positioning protrusion, the positioning protrusion is releasably latched in the latching groove; the movable board further protrudes a shoulder; when the movable board is pulled, the shoulder biases the sloped surface to press the latching block into the receptacle with the coil spring is compressed until the positioning protrusion slides out of the latching groove.

7. The cable management device of claim 6, wherein the cover defines a latching hole, in which the positioning protrusion is releasably latched.

8. A server comprising:
   a sever casing;
   a cable assembly including a first end, a second end and a coil section between the first end and the second end; and
   a cable management device comprising:
   a shell fixed to the server casing, the shell including a first coil winder, a second coil winder, a guiding groove, and at least one stopping member located in the guiding groove;
   a driving assembly slidably fixed in the guiding groove, the driving assembly including a sliding rack and a rotating rack hinged to the sliding rack;
   a cover releasably latched to the shell;
   wherein the first end is fixed to the driving assembly, the second end is fixed to the shell; the coil section is wound to the first coil winder and the second coil winder;
   when the driving assembly slides out of the shell, the driving assembly drives the coil section to be stretched, and the rotating rack rotates relative to the sliding rack to drive the cable assembly to be bent; when the driving assembly slides back in the shell, the coil section is wound to the first coil winder and the second coil winder; the sliding rack comprises two sliding boards, two shafts, and two torsion springs, each sliding board defines a recess, each stopping member is latched in one of the recesses to position the driving assembly in the guiding groove; each shaft protrudes from one of the sliding boards, each torsion spring is wound on one of the shafts; the rotating rack comprises two sliding panels, each panel defines a shaft hole, in which one of the shafts is rotatably fixed so the rotating rack is capable of rotating relative to the sliding rack; the torsion springs provides an elastic force to drive the rotating rack to rotate relative to the sliding rack.

9. The server of claim 8, wherein the sliding rack defines a receiving groove between the sliding boards, in which the cable assembly received;
   each sliding board protrudes a plurality of stopping plates toward the other sliding board to prevent the cable assembly out of the receiving groove.

10. The server of claim 8, wherein the rotating rack defines a channel, through which the cable assembly passes; each panel protrudes a securing block, the cable assembly defines opposite notches, in which the securing blocks are secured to prevent the cable assembly and the rotating rack from separation.

11. The server of claim 8, further comprising a fixed board defining a receiving space, in which the second end is fixed.

12. The server of claim 8, further comprising a positioning assembly including a fixed board, a latching block, a coil spring and a movable board slidably fixed to the fixed board; the fixed board further defines a receptacle, in which the coil spring and the latching block are received in turn; the movable board defines a latching groove, in which the latching block is releasably latched.

13. The server of claim 12, wherein the latching block includes a positioning protrusion opposite to the coil spring, and a sloped surface adjacent to the positioning protrusion, the positioning protrusion is releasably latched in the latching groove; the movable board further protrudes a shoulder; when the movable board is pulled, the shoulder biases the sloped surface to press the latching block into the receptacle with the coil spring is compressed until the positioning protrusion slides out of the latching groove.

14. The server of claim 13, wherein the cover defines a latching hole, in which the positioning protrusion is releasably latched.

15. A cable management device for managing a cable assembly, the cable management device comprising:
- a shell including a first coil winder, a second coil winder, a guiding groove, and at least one stopping member located in the guiding groove;
- a driving assembly slidably fixed in the guiding groove, the driving assembly including a sliding rack and a rotating rack hinged to the sliding rack, the sliding rack comprising two sliding boards, each sliding board defining a recess, each stopping member being latched in one of the recesses to position the driving assembly in the guiding groove;
- a cover releasably latched to the shell;
- wherein the cable assembly includes a first end, a second end and a coil section between the first end and the second end; the first end is fixed to the driving assembly, the second end is fixed to the shell; the coil section is wound to the first coil winder and the second coil winder; when the driving assembly slides out of the shell, the driving assembly drives the coil section to be stretched, and the rotating rack rotates relative to the sliding rack to drive the cable assembly to be bent; when the driving assembly slides back in the shell, the coil section is wound to the first coil winder and the second coil winder.

16. The cable management device of claim 15, further comprising a fixed board defining a receiving space, in which the second end is fixed.

17. The cable management device of claim 15, further comprising a positioning assembly including a fixed board, a latching block, a coil spring and a movable board slidably fixed to the fixed board; the fixed board further defines a receptacle, in which the coil spring and the latching block are received in turn; the movable board defines a latching groove, in which the latching block is releasably latched.

18. The cable management device of claim 17, wherein the latching block includes a positioning protrusion opposite to the coil spring, and a sloped surface adjacent to the positioning protrusion, the positioning protrusion is releasably latched in the latching groove; the movable board further protrudes a shoulder; when the movable board is pulled, the shoulder biases the sloped surface to press the latching block into the receptacle with the coil spring is compressed until the positioning protrusion slides out of the latching groove.

19. The cable management device of claim 18, wherein the cover defines a latching hole, in which the positioning protrusion is releasably latched.

\* \* \* \* \*